(12) United States Patent
Langer et al.

(10) Patent No.: US 11,004,962 B2
(45) Date of Patent: May 11, 2021

(54) INTEGRATED CIRCUIT INCLUDING AT LEAST ONE NANO-RIDGE TRANSISTOR

(71) Applicant: IMEC vzw, Leuven (BE)

(72) Inventors: Robert Langer, Heverlee (BE); Niamh Waldron, Heverlee (BE); Bernardette Kunert, Wilsele (BE)

(73) Assignee: IMEC vzw, Leuven (BE)

(*) Notice: Subject to any disclaimer, the term of this patent is extended or adjusted under 35 U.S.C. 154(b) by 0 days.

(21) Appl. No.: 16/552,468

(22) Filed: Aug. 27, 2019

(65) Prior Publication Data
US 2020/0075750 A1    Mar. 5, 2020

(30) Foreign Application Priority Data
Sep. 4, 2018 (EP) .................................. 18192466

(51) Int. Cl.
| | |
|---|---|
| H01L 29/08 | (2006.01) |
| H01L 29/737 | (2006.01) |
| H01L 21/02 | (2006.01) |
| H01L 27/06 | (2006.01) |
| H01L 29/06 | (2006.01) |
| H01L 29/66 | (2006.01) |

(52) U.S. Cl.
CPC ...... *H01L 29/7371* (2013.01); *H01L 21/0243* (2013.01); *H01L 21/02381* (2013.01); *H01L 27/0623* (2013.01); *H01L 29/0665* (2013.01); *H01L 29/0817* (2013.01); *H01L 29/66318* (2013.01); *H01L 21/02538* (2013.01)

(58) Field of Classification Search
CPC .............. H01L 29/0817; H01L 29/432; H01L 29/66242; H01L 29/66318; H01L 29/66431; H01L 29/66462
See application file for complete search history.

(56) References Cited

U.S. PATENT DOCUMENTS

| | | |
|---|---|---|
| 2011/0049568 A1 | 3/2011 | Lochtefeld et al. |
| 2011/0057266 A1* | 3/2011 | Wallner .............. H01L 27/0623 257/378 |

(Continued)

FOREIGN PATENT DOCUMENTS

EP    3 133 046 A1    2/2017

OTHER PUBLICATIONS

Extended European Search Report dated Mar. 26, 2019 for European Patent Application No. 18192466.3 in 7 pages.

(Continued)

*Primary Examiner* — Hoai V Pham
(74) *Attorney, Agent, or Firm* — Knobbe, Martens, Olson & Bear, LLP

(57) ABSTRACT

The disclosed technology generally relates to integrated circuit devices having at least one transistor, and methods of fabricating the same. In one aspect, an integrated circuit device can be produced from a silicon substrate and can include at least one nano-ridge transistor formed from III-V semiconducting crystal portions. The III-V portions can be grown epitaxially from the silicon substrate using an intermediate portion which can be adapted to produce aspect ratio trapping. The nano-ridge transistor can have a reduced footprint on the silicon substrate, may be adapted for power RF applications, and can be combined with MOS or CMOS transistors within one and a same integrated circuit.

21 Claims, 14 Drawing Sheets

(56) References Cited

U.S. PATENT DOCUMENTS

2011/0310920 A1    12/2011   Lee et al.
2013/0252361 A1     9/2013   Li et al.
2014/0064312 A1     3/2014   Lee et al.
2015/0093884 A1     4/2015   Wang et al.

OTHER PUBLICATIONS

Vert et al., "Integration of InP and InGaAs on 300 mm Si Wafers Using Chemical Mechanical Planarization," ECS Journal of Solid State Science and Technology, vol. 5, No. 9, pp. P478-P482, 2016.
Kunert et al., "III/V nano ridge structures for optical applications on patterned 300 mm silicon substrate," Applied Physics Letters, 109, 091101, pp. 1-5, 2016.

* cited by examiner

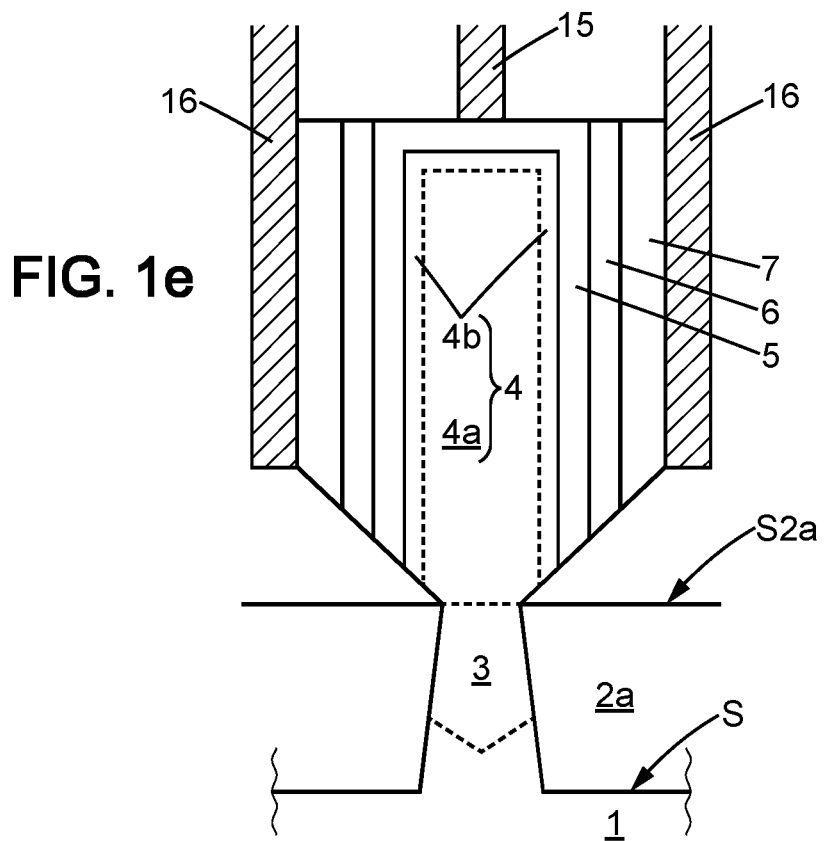
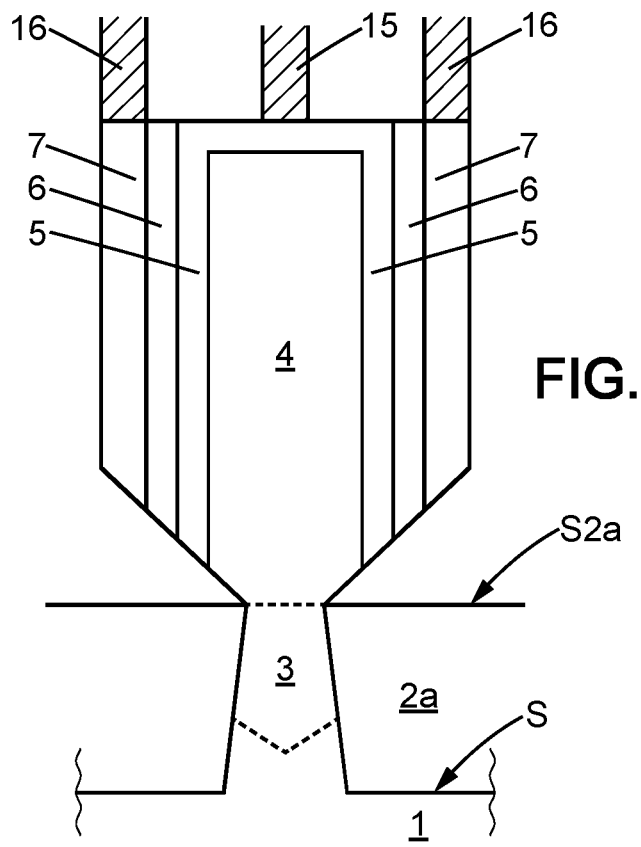

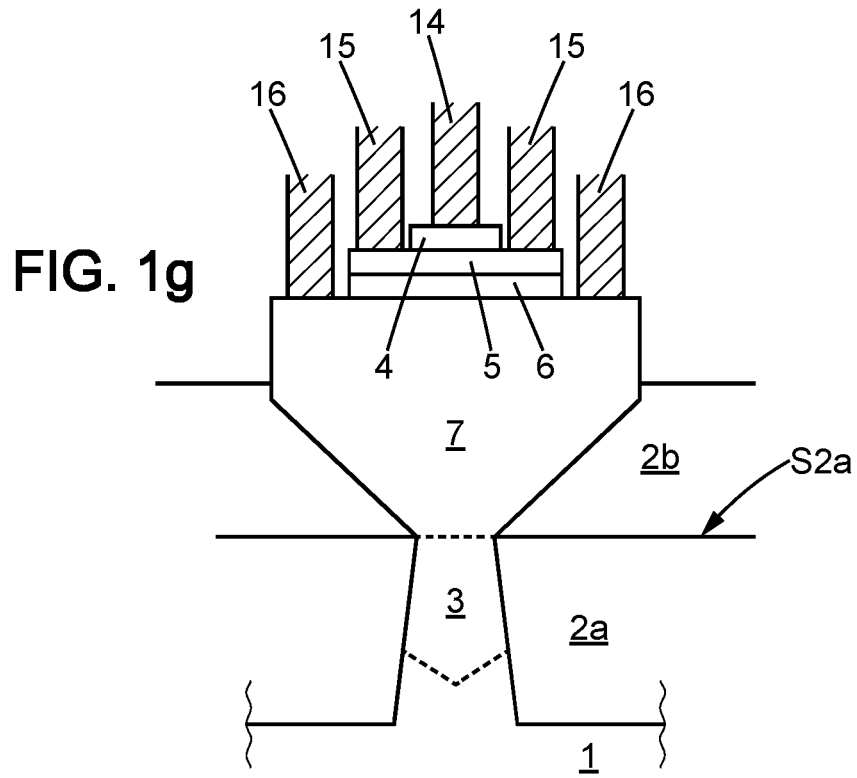
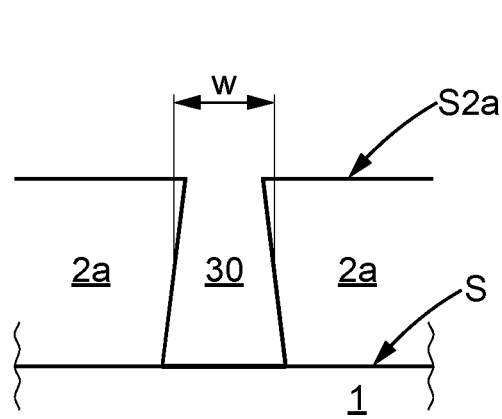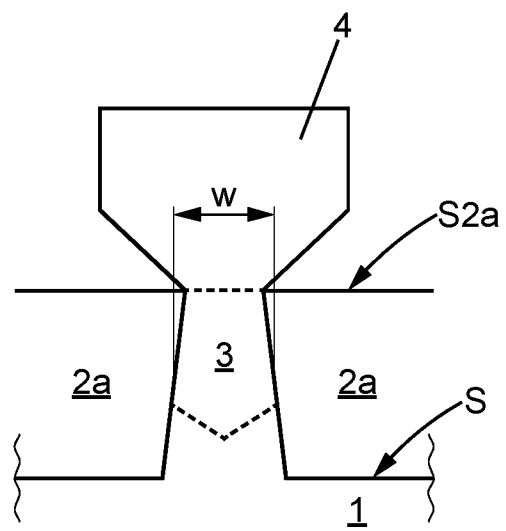

INTEGRATED CIRCUIT INCLUDING AT LEAST ONE NANO-RIDGE TRANSISTOR

CROSS-REFERENCE TO RELATED APPLICATIONS

This application claims foreign priority to European Patent Application No. 18192466.3, filed on Sep. 4, 2018, which is incorporated herein by reference in its entirety.

BACKGROUND

Field

The disclosed technology relates to integrated electronic circuits which include at least one transistor, and methods of producing the same.

Description of the Related Technology

III-V semiconductors can be advantageous materials for producing transistors intended to operate at high frequency and/or for power applications. In particular, they are contemplated for radio frequency (RF)-emitters of mobile terminals, in particular smart phones. However, a major issue includes obtaining crystal portions of such III-V semiconductors which are almost free of crystal defects, because crystal defects such as dislocations can be responsible for a major part of the decrease in the electrical efficiency of a transistor.

Another issue relates to combining III-V semiconductor-based transistors with metal-oxide semiconductor (MOS)- or complementary metal-oxide semiconductor (CMOS) technology in a cost-efficient manner. In particular, it is desirable to combine III-V semiconductor-based transistors with using a silicon substrate, and also that the contact level and metallization levels in the complete integrated circuit architecture can be shared between the III-V semiconductor-based transistors and other MOS- and/or CMOS transistors that are also formed from the silicon substrate.

Additional issues also include reducing the footprint of each III-V semiconductor-based transistor at the substrate surface, and compatibility with high integration levels.

The article entitled "III/V nano ridge structures for optical applications on patterned 300 mm silicon substrate" by B. Kunert et al., Applied Physics Letters 109, 091101, 2016, discloses producing ridges of III-V material through epitaxial growth from a silicon substrate with (001) orientation of the substrate surface. To this end, the silicon substrate is covered with a silica ($SiO_2$) layer in which trenches are provided so as to expose the silicon surface at the bottom of the trenches. The trenches are 20 nm (nanometer) to 500 nm in width, and are implemented to limit laterally the epitaxial crystal growth during a first period of the growing duration. In this way, selective epitaxial growth is achieved in desired areas of the substrate surface, and the technique known as "Aspect Ratio Trapping", or ART, allows reducing in a great extent the amount of crystal defects that are present in the epitaxially grown material. Lateral overgrowth occurs once the upper surface of the crystal grown becomes higher than the upper edges of the trenches. In this way, a trade-off is obtained between the footprint at the substrate surface and the useful cross-section of the III-V semiconductor portions that are obtained above the silica layer. The silica layer with the trenches may be produced through the shallow trench isolation (STI) process.

Starting from this situation, one objective of the disclosed technology includes providing III-V semiconductor-based transistors from a silicon substrate, in particular such transistors which are suitable for power RF-applications.

Additional objectives include compatibility with additional MOS or CMOS transistors on one and the same silicon substrate, and high integration level.

SUMMARY OF CERTAIN INVENTIVE ASPECTS

For meeting at least one of these objectives or others, an aspect of the disclosed technology proposes an integrated electronic circuit which includes at least one transistor, called a nano-ridge transistor. This circuit can include:
  a crystal silicon substrate having a silicon surface;
  the nano-ridge transistor, which comprises at least three III-V semiconducting crystal portions superposed so that at least part of one of the III-V portions is intermediate between respective parts of two other ones of the III-V portions along a superposition direction, and a first one of the III-V portions is connected to the silicon surface of the substrate through an epitaxial material transition, and those of the III-V portions which are next to one another have epitaxial interfaces in-between;
  at least three electrical connections which are arranged so that three parts of the III-V portions of the nano-ridge transistor are each electrically contacted by at least one of these electrical connections; and
  an electrically insulating portion which is supported by the silicon substrate and abuts laterally against at least one of the III-V portions.

According to some implementations, the first III-V portion of the nano-ridge transistor can be connected to the silicon surface through an intermediate portion which contains the epitaxial material transition. This intermediate portion can also be abutted laterally by the electrically insulating portion, and can be equal or less in thickness than the electrically insulating portion along a direction which is perpendicular to the silicon surface. In addition, the intermediate portion can have an aspect ratio greater than unity, e.g., greater than or equal to 1.7 in some instances. This aspect ratio can be equal to the thickness of the intermediate portion divided by its width measured parallel to the silicon surface. In this way, the intermediate portion can be efficient in producing aspect ratio trapping with respect to crystal defects that may exist in the epitaxially grown material. Thus, in some implementations, the III-V portions can be almost free of crystal defects, and the transistor can have good electrical features. In particular, the transistor can be adapted for power RF-applications.

In some instances, for increasing the efficiency of the aspect ratio trapping, an epitaxial interface between silicon and a material of the first III-V portion may have a V-shape within the intermediate portion, with the V-tip oriented towards the silicon substrate.

A function of the electrically insulating portion may be in particular to limit transversally a cross-sectional area of the intermediate portion, parallel to the silicon surface, so that aspect ratio trapping can occur. Depending on various implementations of the disclosed technology, the electrically insulating portion may be partially formed through the shallow trench isolation (STI) process, or be part of the buried oxide layer of a silicon-on-insulator (SOI) type substrate, or be formed using any material deposition process known in the art, without limitation. Also, the electrically insulating portion may be comprised of several parts which may be individually either formed through the shallow trench isolation (STI) process, or be part of the buried oxide layer of a silicon-on-insulator type substrate (SOI), or be formed using any material deposition process known in the art, without limitation.

According to some configurations, the whole nano-ridge transistor may be lower in height than a part of the electrically insulating portion which has opposed side faces that are parallel or almost parallel. In some such configurations, the nano-ridge transistor can be contained in a trench through the electrically insulating portion, between the parallel or almost parallel side faces thereof. Alternatively in other configurations, a cross-sectional area of the first III-V portion parallel to the silicon surface may increase when moving away from the silicon surface for at least part of this first III-V portion which is close to the intermediate portion.

Generally for the disclosed technology, the superposition direction of the III-V portions may be perpendicular or parallel to the silicon surface, for at least respective parts of the III-V portions which are superposed along this superposition direction. Possibly, at least one of the epitaxial interfaces existing between two of the III-V portions may have a U-shape in a cross-sectional plane which is perpendicular to the silicon surface, with two U-arms pointing towards the silicon substrate. A length of the U-arms with respect to a width of the first III-V portion parallel to the silicon surface may be any, thereby allowing any area for the interfaces between neighboring ones of the III-V portions.

In some instances when respective parts of the III-V portions are superposed along a superposition direction which is parallel to the silicon surface, at least one of the electrical connections may have a contact interface with one of the III-V portions, which is perpendicular to the silicon surface. This can allow a large contact area between the III-V portion of the nano-ridge transistor and the electrical connection, to reduce a contact resistance existing between the III-V portion and the electrical connection. This may be advantageous in particular for a power transistor.

Generally for the disclosed technology, some of the electrical connections to the nano-ridge transistor may contact this latter through an upper surface thereof which is parallel to the silicon surface, or through at least one of the lateral faces of the nano-ridge transistor which are perpendicular to the silicon surface. However, other connection configurations are also possible, without limitation.

In some implementations of the disclosed technology, the integrated circuit may further include at least one MOS or CMOS transistor, and at least one of the electrical connections to the nano-ridge transistor and other electrical connections to the MOS or CMOS transistor can have respective segments which all belong to one and the same connection level of the integrated circuit. In this way, the one and the same integrated circuit can combine nano-ridge transistors according to the disclosed technology and MOS or CMOS transistors to produce a complete function, possibly including both a signal processing and a RF emitter.

The nano-ridge transistor may be of various types depending on the III-V portions, including a heterojunction bipolar transistor (HBT) and a high electron-mobility transistor (HEMT).

For a HBT, three of the III-V portions can form an emitter, a base, and a collector of the nano-ridge transistor, respectively, and optionally a fourth one of the III-V portions may form a sub-collector of the nano-ridge transistor. Subsequently, in possible connection configurations, a portion of the silicon substrate which is connected to the first III-V portion through the intermediate portion may form one of the electrical connections, in particular to the emitter or the collector or sub-collector.

For a HEMT, the first III-V portion can form a non-doped buffer, a second one of the III-V portions can form a non-doped channel, a third one of the III-V portions can form a barrier which has a doping region spatially separate from the channel, and optionally a fourth one of the III-V portions may form a contact layer for the source and drain of the nano-ridge transistor.

Another aspect of the disclosed technology proposes a method of producing an integrated circuit which includes at least one nano-ridge transistor. This method can include:

/1/ providing a crystal silicon substrate, with part of a silicon surface thereof which is covered by an electrically insulating bottom portion, and with an aperture through this electrically insulating bottom portion where an area of the silicon surface is selectively exposed, and such that a ratio of a thickness of the electrically insulating bottom portion next to the aperture over a width of this aperture is greater than unity, e.g., greater than or equal to 1.7 in some instances, these thickness and width being measured perpendicular and parallel to the silicon surface, respectively;

/2/ from the exposed area of the silicon substrate, growing an intermediate portion and subsequently a first III-V semiconducting crystal portion using an epitaxial growing process, the intermediate portion containing an epitaxial material transition between silicon and the first III-V portion, and being equal or less in thickness than the electrically insulating bottom portion along a direction perpendicular to the silicon surface, so that at least the intermediate portion can be limited laterally during the epitaxial growing process by the electrically insulating bottom portion around the aperture;

/3/ growing successively at least two further III-V semiconducting crystal portions, using epitaxial growing processes from the first III-V portion and subsequently from the III-V portion just preceding, and so that at least part of one of these III-V portions can be intermediate between respective parts of two other ones along a superposition direction; and /4/ forming at least three electrical connections which are arranged so that three parts of the III-V portions can be each electrically contacted by at least one of these electrical connections.

The intermediate portion can have a thickness-to-width ratio, called an aspect ratio, greater than unity, e.g., greater than 1.7 in some instances, and the III-V portions can form the nano-ridge transistor.

Generally for the disclosed technology, the method also can include depositing additional electrically insulating material, so that this additional electrically insulating material can abut laterally against at least one of the III-V portions, in addition to the electrically insulating bottom portion abutting against the intermediate portion. The electrically insulating portion recited in some aspects can include at least both the electrically insulating bottom portion and the additional electrically insulating material. However, depending on various implementations, the deposition of the additional electrically insulating material may be performed at various times with respect to /1/ to /4/.

Some such methods can allow obtaining an integrated circuit according to some aspects.

In some implementations, the silicon surface of the substrate may be perpendicular to a [001] crystal direction of silicon and of the III-V portions.

In some advantageous implementations of the disclosed technology, /1/ may include:

etching the silicon substrate so as to form a cavity and lower the silicon surface; followed by forming the electrically insulating bottom portion within the cavity; followed by hollowing out the aperture and a volume in the electrically insulating bottom portion, the hollowed volume being in line with the aperture along the direction perpendicular to the silicon surface.

For some such implementations, a depth of the hollowed volume may be selected so that the nano-ridge transistor is contained in this hollowed volume below the silicon surface of the substrate as existing before the substrate has been etched. This can allow having the nano-ridge transistor below the silicon surface, so that the electrical connections to this nano-ridge transistor can be at a same level as electrical connections to MOS and/or CMOS transistors possibly also included in the same integrated circuit.

Generally for the disclosed technology, the silicon substrate may be of a silicon-on-insulator type, thus comprising a bulk crystal silicon substrate, which is covered by a buried oxide layer and an upper layer of crystal silicon. In some such cases, the buried oxide layer may form the electrically insulating bottom portion, and the aperture can be formed through at least part of the buried oxide layer. The intermediate portion can be subsequently grown in /2/ from the bulk crystal silicon substrate, or from a crystal silicon extension which has been grown epitaxially from the bulk crystal silicon substrate in the aperture.

According to possible improvements of the disclosed technology which can allow better control of the shape of the intermediate portion, /1/ may include:

forming a sacrificial intermediate template on the substrate, which intermediate template extends from the silicon surface of the substrate and has a shape which matches side faces of the intermediate portion;

forming the electrically insulating bottom portion on the silicon surface so that the intermediate template is embedded in the electrically insulating bottom portion;

polishing the electrically insulating bottom portion until the intermediate template becomes uncovered; and selectively removing the intermediate template so that the silicon surface of the substrate becomes exposed through the electrically insulating bottom portion, thus forming the aperture.

Subsequently, /2/ can be carried out so that the intermediate portion replaces the intermediate template. According to other possible improvements of the disclosed technology which can allow better control of the shape of the nano-ridge transistor, /2/ may include:

growing the intermediate portion from the exposed area of the silicon substrate using the epitaxial growing process, the intermediate portion being limited laterally when growing by the electrically insulating bottom portion;

forming a sacrificial nano-ridge template which extends above and from the intermediate portion and has a shape which matches side faces of the nano-ridge transistor;

depositing the additional electrically insulating material on the electrically insulating bottom portion, so that the nano-ridge template is embedded in this additional electrically insulating material;

polishing the additional electrically insulating material until the nano-ridge template becomes uncovered;

selectively removing the nano-ridge template so that the intermediate portion becomes exposed through the additional electrically insulating material; and growing epitaxially the first III-V portion and the subsequent at least two further III-V portions from the exposed intermediate portion, so that the first and further III-V portions replace the nano-ridge template.

BRIEF DESCRIPTION OF THE DRAWINGS

The disclosed technology will be now described with reference to the following figures which illustrate several embodiments or implementations of the disclosed technology, but without limitation with respect to any combination thereof and equivalent implementations:

FIGS. 1a, 1b, 1c, 1d, 1e, 1f, and 1g are cross-sectional views of integrated electronic circuits according to several embodiments of the disclosed technology.

FIGS. 2a, 2b, 2c, 2d, and 2e illustrate a method suitable to produce integrated circuits according FIGS. 1a-1g.

For clarity sake, element sizes which appear in these figures do not correspond to actual dimensions or dimension ratios. Also, same reference numbers which are indicated in different ones of these figures denote identical elements of elements with identical function.

DETAILED DESCRIPTION OF CERTAIN ILLUSTRATIVE EMBODIMENTS

Figure 1A:
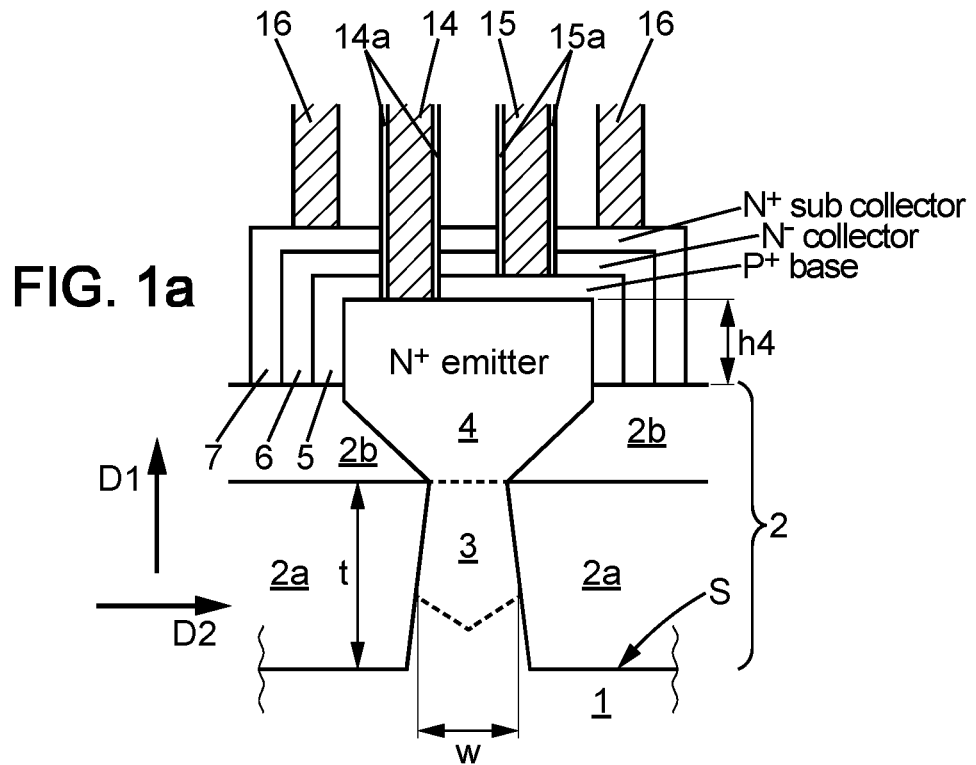

FIG. 1a shows an example implementation of the disclosed technology. Reference number 1 denotes a silicon substrate with silicon surface S. Reference number 2 denotes an electrically insulating portion, which may be generally of silica ($SiO_2$) but resulting from a composite material formation sequence. In many of the implementations, the portion 2 includes or is comprised of two sub-parts 2a and 2b, which may be formed using different processes and at separate times during the production of the integrated circuit, as described herein. A general function of the sub-part 2a, e.g., an electrically insulating bottom portion, can include controlling the shape of an intermediate portion 3. The sub-part 2b, e.g., an additional electrically insulating material, can be either dedicated to controlling the shape of a nano-ridge transistor, or can have a filling function for integrity of the integrated circuit.

The nano-ridge transistor of the integrated electronic circuit, e.g., FIG. 1a, can be of a heterojunction bipolar transistor (HBT) type. It can include or is comprised of at least three III-V semiconductor crystal portions labelled 4, 5 and 6. The III-V portion 4 can form the emitter of the HBT transistor and can be doped N+, and the III-V portion 5 can form the base of the HBT transistor and can be doped P+. The collector of the HBT transistor may be formed by the portion 6 alone, which can be doped N+ in some such cases. However, in some instances, the collector may be formed by a combination of the portion 6 doped N− with a further III-V portion 7 which can be doped N+ and can form a sub-collector. In some instances, the emitter-base-collector functions for the III-V portions may be reversed with respect to the location order of these III-V portions from the intermediate portion 3.

In the implementation of FIG. 1a, the III-V portions 4-7 in the center part of the nano-ridge transistor are superposed along a direction D1 which is perpendicular to the silicon surface S. They are also superposed in both lateral parts of the nano-ridge transistor but along another direction D2 which is parallel to the silicon surface S, as this appears in the figure.

All the III-V portions 4-7 can have crystal structures with epitaxial interfaces therebetween. In addition, the intermediate portion 3 can contain an epitaxial material transition which can form a bridge between the crystal silicon of the substrate 1 and the crystal composition of the III-V portion 4. Possibly, a bottom part of the intermediate portion 3, close to the substrate 1, may still be of silicon to obtain an improved epitaxial growth of the III-V materials, with less crystal defects. The upper limit of some such bottom parts may have a V-shape, with the V-tip pointing toward the substrate 1. In the figures, this V-shape is indicated in broken line, and indicates a possible location where the chemical composition has been started to move from silicon to the III-V composition of the portion 4. As explained herein, the function of the intermediate portion 3 can include trapping the crystal defects through aspect ratio effect. To this end, a mean width w of the intermediate portion 3 can be less than a thickness t of the same intermediate portion 3. Put another way, the ratio t/w, e.g., an aspect ratio, can be higher than unity, e.g., higher than 1.7 in some instances. A possible variation—reduction—in width w of the intermediate portion 3 when moving away from the substrate surface S may not matter significantly, and may be due to etching behavior of the bottom portion 2a of the insulating portion 2. Typically, the width w of the intermediate portion 3 may be comprised between 20 nm (nanometer) and 500 nm.

III-V compositions which can be suitable for the portions 3 and 4-7 are not limited, so that non-limiting examples are only provided herein. Roman numerals III and V refer to columns of the Mendeleev element table. A possible material combination can be AlGaAs (aluminum-gallium-arsenide) for the emitter, and GaAs for both the base and the collector but with different stoichiometric ratios. Another possible material combination can be InP (indium-phosphide) for the emitter, and InGaAs for both the base and the collector but again with different stoichiometric ratios. Other possible combinations can be based on GaN (gallium nitride), with additional aluminum content for the emitter or additional indium content for the base. Still other possible combinations may include Sb (Antimony) contents. The appropriate material combinations for the III-V portions of the nano-ridge transistor can be selected not only with respect to the electrical material properties, but also with respect to the lattice parameters which can be compatible with that of silicon through epitaxial growth.

Reference numbers 14, 15 and 16 denote electrical connections arranged to contact the III-V portions 4, 5 and 7, respectively. These electrical connections may be produced after the III-V portions 4-7 have been formed, from the circuit side which is opposite the substrate 1 and using a sequence of selective etching and filling. In some implementations, shafts which are etched through the III-V portions 5-7 to connect the III-V portions 4 or 5 can be lined internally with insulating material such as silica before being filled with conducting material. Reference signs 14a and 15a denote such insulating liners. The electrical connections 14-16 as shown in FIG. 1a all intersect the cross-sectional plane of the view for illustrative purpose, but this may not be the case practically. In particular, it may be convenient to locate the electrical connections 14 and 15 in line with one another along a direction perpendicular to the cross-sectional plane of the view. Also, in some practical implementations of the disclosed technology, the nano-ridge transistor may be elongated perpendicular to the cross-sectional plane of the view, and each of the electrical connections 14-16 may be repeated along this elongation direction.

Figure 1B:
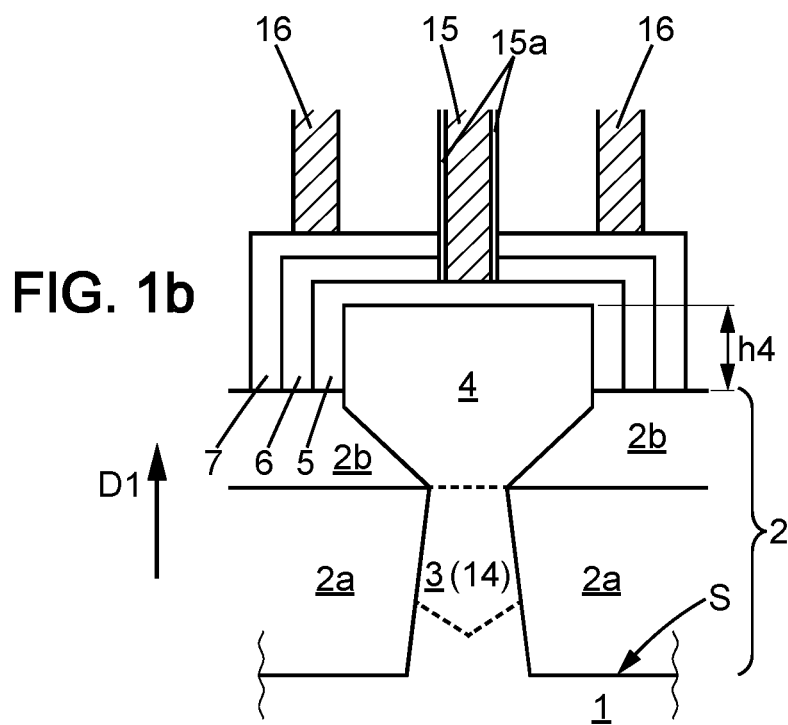

FIG. 1b illustrates another contact configuration for a nano-ridge transistor according to the disclosed technology, in which the function of electrically connecting the III-V portion 4 can be achieved by the intermediate portion 3 and an appropriate conduction path within the substrate 1.

Figure 2C:
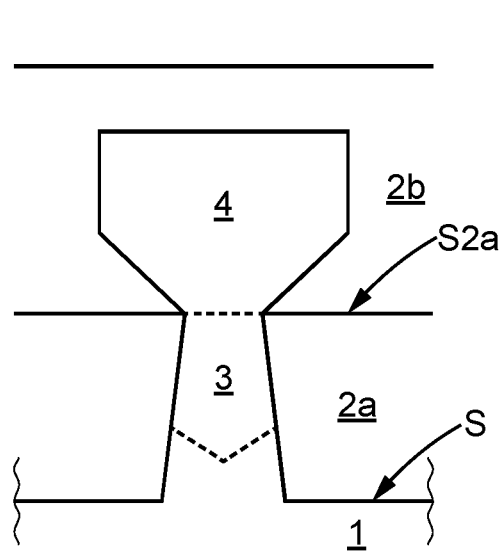

A method of producing the nano-ridge transistor of FIG. 1a is now described with reference to FIGS. 2a-2e. A silica layer may be first formed on the silicon surface S of the substrate 1, with an aperture 30, to form the electrically insulating bottom portion (FIG. 2a). Such bottom portion 2a may be formed during the shallow trench isolation (STI) process sequence. The aperture 30 can be designed for exposing the silicon surface S through the bottom portion 2a. Possibly, the aperture 30 may be elongated perpendicular to the cross-sectional plane of the figure. Subsequently, epitaxial material growth can be implemented so as to form successively the intermediate portion 3 and the III-V portion 4. The epitaxial growing process which is used is controlled to vary the material composition in the intermediate portion 3 while maintaining crystal structure formation. In some implementations, the epitaxial growing process may be started with depositing pure silicon, thus forming the bottom part of the intermediate portion 3 with a V-shaped upper limit. Subsequently, the material composition can be made to vary until the composition which is desired for the III-V portion 4 is obtained. Also in some implementations, the composition of the III-V portion 4 may be obtained before the growing surface of the epitaxial growing process has reached the upper surface S2a of the bottom portion 2a. This part of the epitaxially deposited material can form the intermediate portion 3, and can be limited laterally during the material growth by the width w of the aperture 30. The crystal material as grown can abut against the side walls of the bottom portion 2a on either side of the aperture 30. According to the disclosed technology, the ratio thickness-to-width t/w of the aperture 30 can be higher than 1.0, e.g., higher than 1.7 in some instances, so that epitaxial growing of the intermediate portion 3 can produce aspect ratio trapping. In this way, the III-V crystal material which can be obtained above the upper surface S2a of the bottom portion 2a, to form the portion 4, can have a low or very low amount of crystal defects. The epitaxial growing process can be continued after the growing surface has passed above the surface S2a, e.g., with constant composition of the material deposited. This continuation of the epitaxial growing process can produce the III-V portion 4 in the form of a nano-ridge. In the implementation now described, such nano-ridge can be located above the upper surface S2a of the bottom portion 2a, and may no longer be restricted laterally, e.g., no solid wall present to abut against the material grown parallel to the upper surface S2a. The nano-ridge thus grown free of lateral bounds can have a width which increases from the edges of the aperture 30, up to a maximum width value, and subsequently can be constant in width in a top part of the nano-ridge. Such shape of the III-V portion 4 is shown in FIG. 2b. When continuing the epitaxial growing process, the maximum width of the III-V portion 4 can increase, above angled intermediate faces which remain with constant angle with respect to the surface S2a, and the total height of the III-V portion 4 also can increase. Such growing behavior can be due to the crystal structure of the material deposited.

A layer of the additional electrically insulating material 2b can subsequently be deposited above the bottom portion 2a, so as to embed the III-V portion 4 (FIG. 2c). Possibly, the additional material 2b may be silica deposited using a chemical vapor deposition (CVD) process, for example a plasma-enhanced CVD process.

Figure 2D:
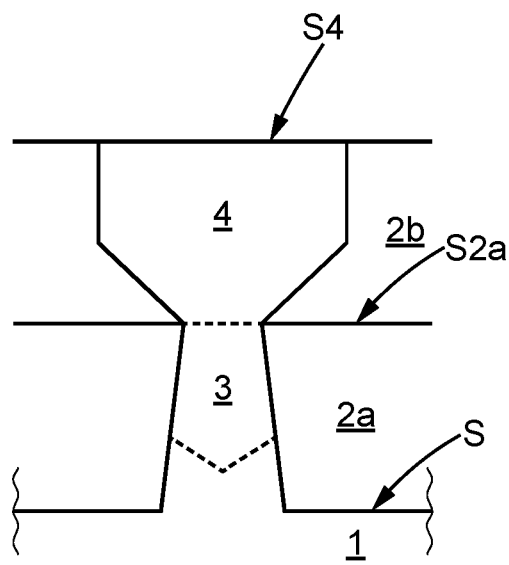

Chemical mechanical polishing (CMP) can be achieved subsequently so as to expose a top part of the III-V portion 4 (FIG. 2d). In this way, a top surface S4 of the III-V portion 4 can be uncovered and parallel to the silicon surface S.

Optionally, the layer of the additional insulating material 2b may be further etched, using an etching process that is selective with respect to the III-V material of the portion 4. Some such selective etching processes may depend on the additional material 2b and the composition of the III-V portion 4. For example, a wet etching process may be used when the additional material 2b is silica and the III-V portion 4 is of an AlGaAs or InP alloy. Thus, the additional material 2b can have a top surface S2b which is lower than the top surface S4 of the III-V portion 4. The difference in height between the top surfaces S2b and S4, denoted h4 in FIG. 2e, may be selected as desired by controlling a duration of the etch-back step.

Subsequently, the epitaxial growing process can be resumed, or another epitaxial growing process, from the exposed surface of the III-V portion 4. It may be advantageous to clean beforehand to remove pollutants that may be present on the exposed surface of the III-V portion 4. The composition of the material which is deposited epitaxially can be controlled to match the target compositions for the III-V portions 5-7. The III-V portions 5-7 can thus be formed successively, e.g., without interrupting the epitaxial growing process between them, but implementing discontinuities in the composition of the material being deposited when changing from the portion 5 to the portion 6, and subsequently from the portion 6 to the portion 7. These compositions can be selected to allow epitaxial material transitions between the portions 4 and 5, between 5 and 6, and also between 6 and 7, and also so that they may produce the electrical functions desired for the transistor operation. Intrinsic doping of the III-V portions 4-7 can thus be obtained.

The integrated circuit can be completed by forming a further additional electrically insulating layer (not shown) on the top surface S2b, so as to embed the III-V portions 4-7 and also forming a first low-k dielectric level, followed by producing the electrical connections 14-16. Thereafter, metallization layers may be produced. For example, the further additional insulating layer may be produced using a process similar to that of the additional insulating material 2b. The integrated circuit of FIG. 1a can thus be obtained.

Figure 1C:
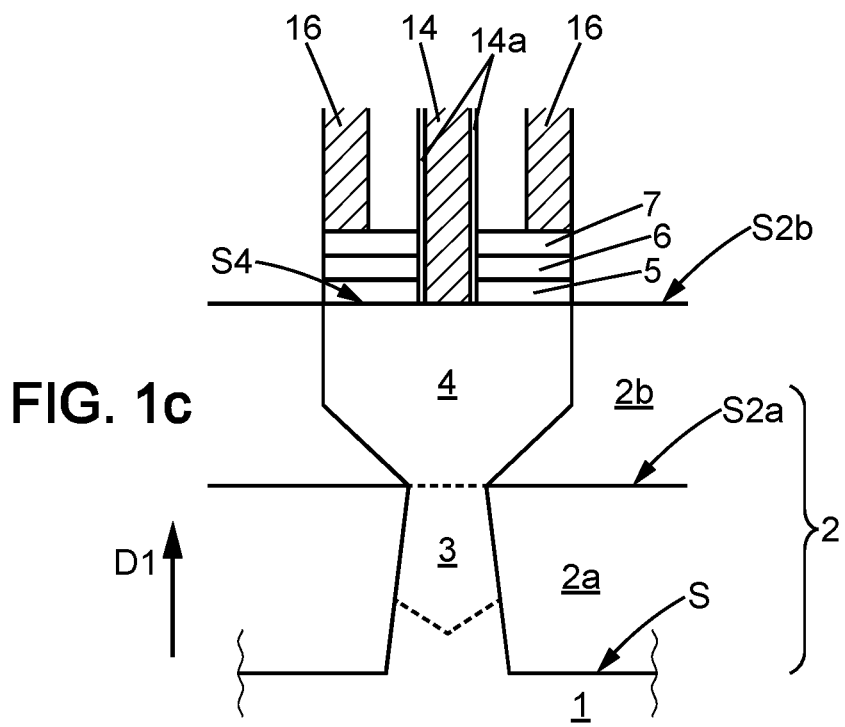
Figure 2E:
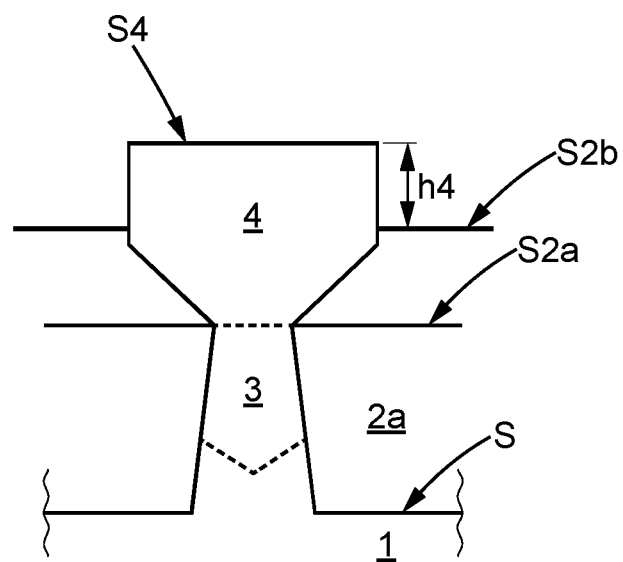

FIG. 1c shows an alternative implementation of the disclosed technology, which may be obtained through the production method described but without implementing the etch-back step of FIG. 2e. The epitaxial growing process can thus be resumed immediately following the CMP of FIG. 2d, so that the top surfaces S2b and S4 can be at a same level above the silicon surface S. Cleaning to remove pollutants on the exposed surface of the III-V portion 4 may be maintained. Subsequently, the epitaxial growing of the III-V portions 5-7 can lead to the cross-sectional outline shown in FIG. 1c: the III-V portions 5-7 can have a same width as the III-V portion 4. Subsequently, the integrated circuit may be completed as mentioned herein. In some such implementations of the disclosed technology, the III-V portions 4-7 are superposed along the direction D1 in the whole nano-ridge transistor.

Figure 1D:
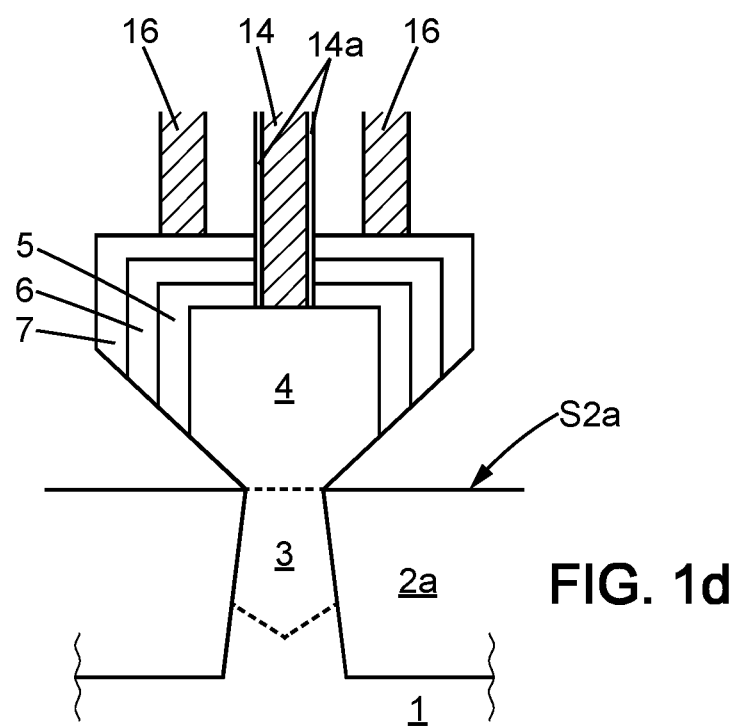

The cross-sectional outline of the III-V portions 5-7 may be controlled to be different from those represented in FIGS. 1a and 1c. For example, FIG. 1d represents still another outline which may be obtained if no additional electrically insulating material 2b is implemented before all the III-V portions 4-7 are grown epitaxially.

FIG. 1e shows another alternative embodiment of the disclosed technology, in which the material of the III-V portion 4 can be selected to have an epitaxial growth speed value along the crystal axis which is perpendicular to the silicon surface S greater than the growth speed values along the crystal axes which are parallel to this surface S. In a same or similar way as for the implementation of FIG. 1d, no additional insulating material 2b is implemented before the III-V portions 4-7 have been all grown epitaxially. In some instances, the III-V portion 4 may include or be comprised of two parts: a core part 4a which can be grown epitaxially from the intermediate portion 3, and a surrounding part 4b which can be grown epitaxially from the core part 4a and can produce the electrical function desired for the III-V portion 4 in the transistor operation. The material of the core part 4a may be selected for its anisotropy in growth speed value so as to provide a desired height-to-width ratio to the core part 4a. In some such implementations, the intermediate portion 3, the core part 4a, the surrounding part 4b and III-V portions 5-7 may be grown successively from the area of the silicon surface S which can be limited by the aperture 30, e.g., without interruption of the epitaxial growing process. For example, the core part 4a may include or be comprised of a GaAs alloy, and the surrounding part may include or be comprised of a InGaP alloy. The integrated circuit may be completed as described herein, but for some such implementations, it may be advantageous to produce the electrical connections 16 so that each one contacts the III-V portion 7 on a side-surface of this latter which is perpendicular to the silicon surface S. Contacts with lower resistance values can be obtained in this way. FIG. 1e shows one such implementation, in which the electrical connection to the emitter 4 is optionally achieved through the core part 4a and the intermediate portion 3. In addition, the III-V portions 6 and 7 have been removed at the top of the nano-ridge, for example through CMP after deposition of the additional electrically insulating material 2b, to expose the III-V portion 5 and making it easier to access it with the electrical contact 15. The electrical connections 16 may alternatively have a design similar to that of the electrical connection 15, to contact the III-V portion 7 at the top face of the nano-ridge as shown in FIG. 1f. One advantage thereof is to produce the electrical connections 15 and 16 simultaneously. Generally, the implementations of FIGS. 1e and 1f can allow an even more reduced footprint of the nano-ridge transistor at the silicon surface S, increased junction areas within the transistor, as defined by the height of the nano-ridge. They also can allow decoupling of the base thickness as measured perpendicular to the junction surfaces and the base contact resistance value.

FIG. 1g shows still another implementation of the disclosed technology, which may be contemplated in particular when the material of the first III-V portion which can be grown after the intermediate portion 3 has a growth speed value parallel to the silicon surface S higher than that along the direction perpendicular to this silicon surface S. For example in some such implementations, the growth order is first the III-V portion 7 which can form the N+ sub-collector, second the III-V portion 6 which can form the N− collector, third the III-V portion 5 which can form the P+ base, and the III-V portion 4 which can form the N+ emitter. The additional insulating material 2b may be deposited after all the III-V portions have been epitaxially grown. Subsequently, the III-V portions 4-6 may be etched according to a stair-like outline as represented, to allow contacting the III-V portions 4, 5 and 7 with the electrical connections 14-16 from above of the transistor, opposite the substrate 1. Possibly, when such nano-ridge transistor is elongated perpendicular to the sectional plane of the figure, each electrical connection may also be elongated parallel to the same direction for reducing all the contact resistance values.

Figure 3A:
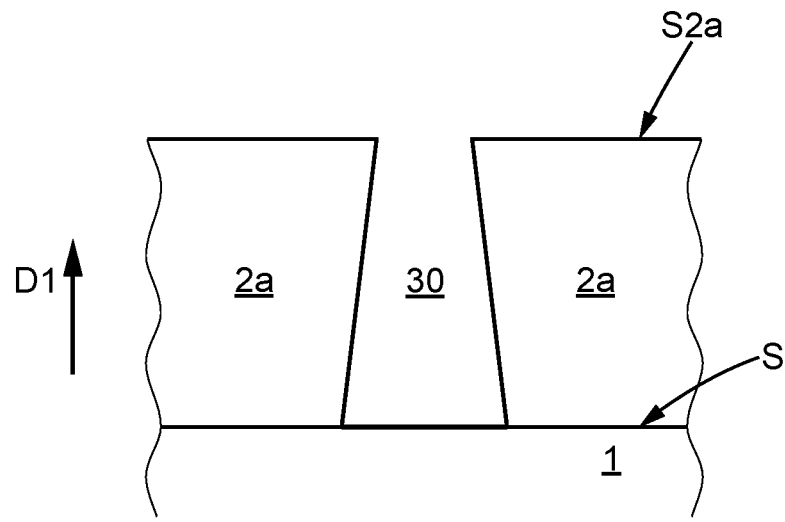
FIGS. 3a-3b illustrate a method suitable to produce integrated circuits according to an alternative implementation of the disclosed technology.
Figure 3B:
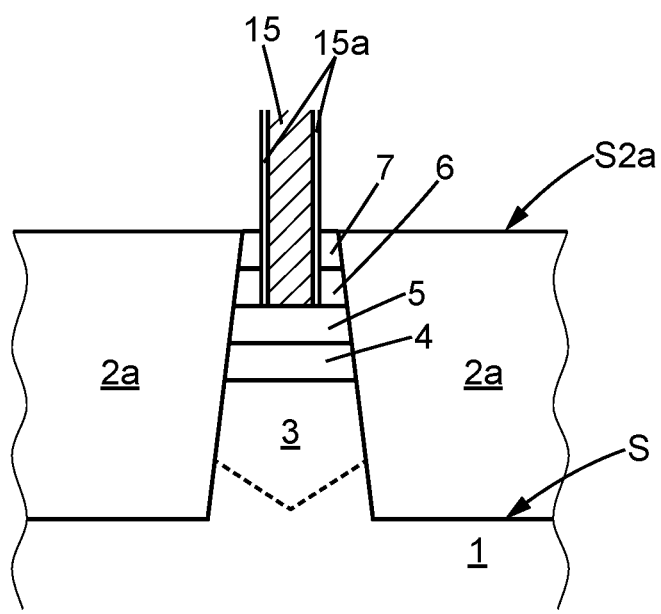

FIGS. 3a and 3b relate to another implementation of the disclosed technology, in which the complete nano-ridge transistor can be contained within the aperture 30 through the electrically insulating bottom portion 2a. To this end, the bottom portion 2a may be thicker than that of FIG. 2a, along the direction D1 (FIG. 3a). Subsequently, the epitaxial growth of the intermediate portion 3 and the III-V portions 4-7 can be carried out as described herein, but with the composition variations all performed before the epitaxial growth surface has reached the upper surface S2a of the bottom portion 2a. FIG. 3b also shows an electrical connection 15 to the III-V portion 5, through the top face of the nano-ridge. Similar connections may be used to contact the III-V portions 4 and 7, respectively, but e.g. out of the cross-sectional plane of the figure when the nano-ridge transistor is elongated perpendicular to this plane.

Figure 4A:
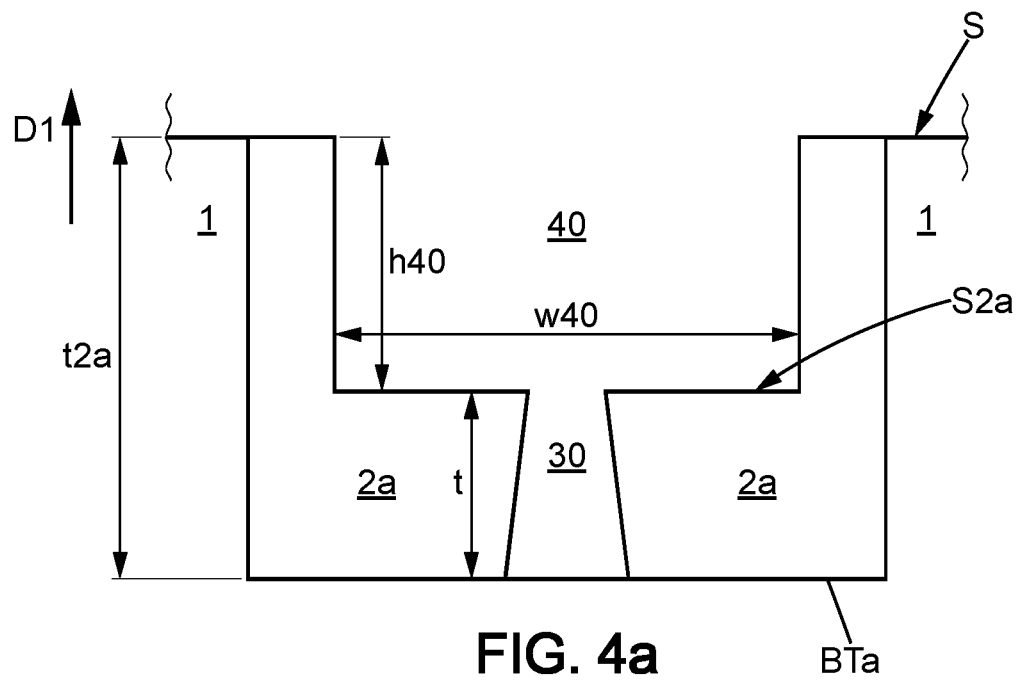
FIGS. 4a, 4b, and 4c illustrate a method suitable to produce integrated circuits according to another alternative implementation of the disclosed technology.
Figure 4B:
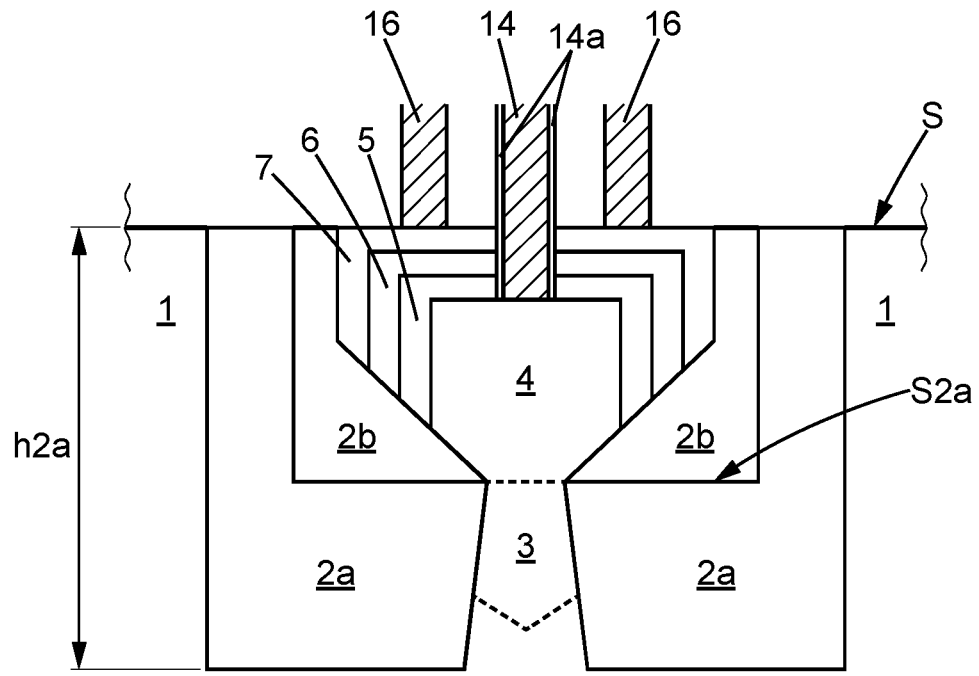
Figure 4C:
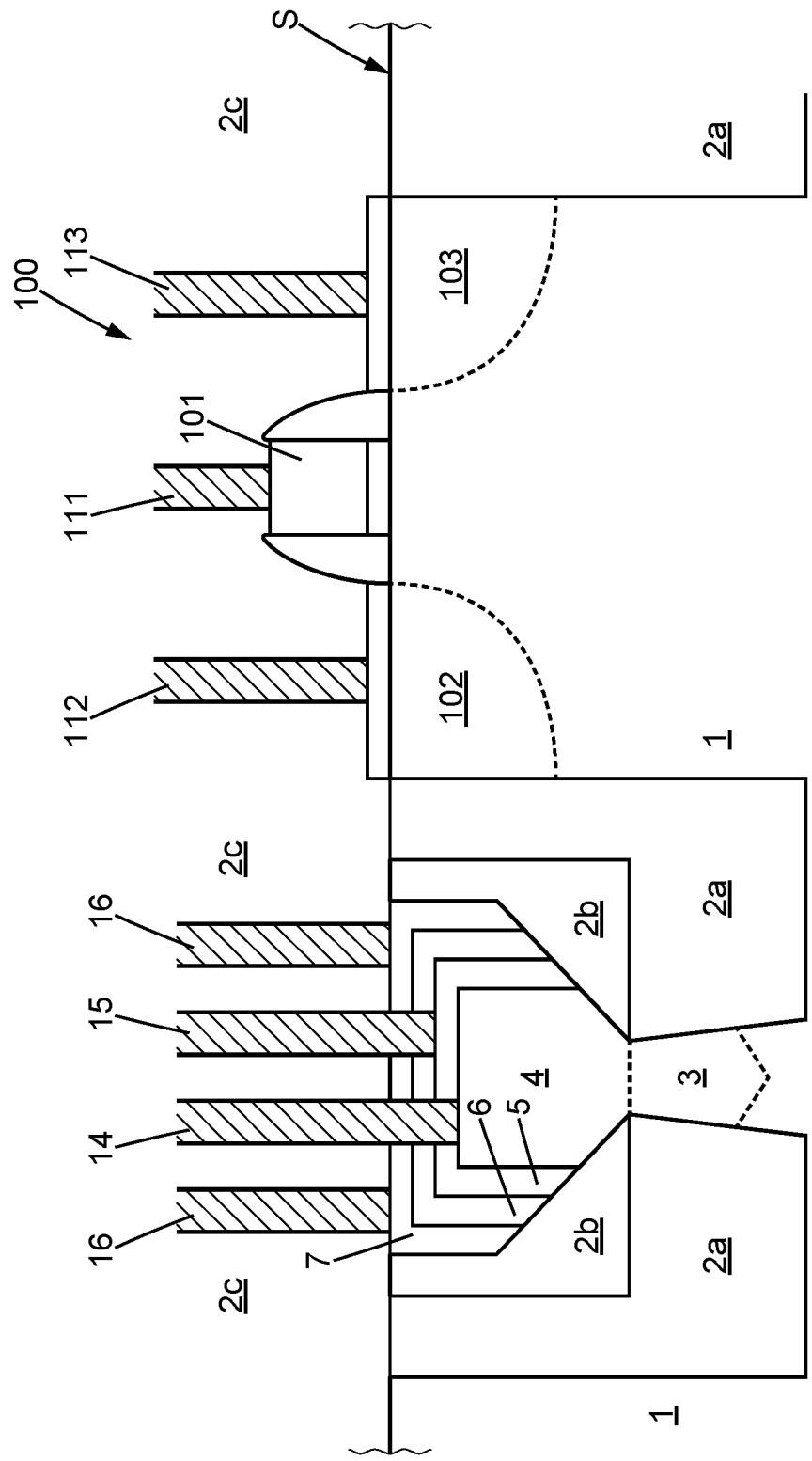

FIGS. 4a and 4b relate to still another implementation of the disclosed technology, which can be designed to lower the nano-ridge transistor below the silicon surface S. This can allow easier co-integration of the nano-ridge transistor with MOS and/or CMOS transistors on one and the same silicon substrate 1. As shown in FIG. 4a, a cavity is first formed in the silicon substrate 1 from its surface S, and filled with the electrically insulating bottom portion 2a, e.g., using the STI process. The thickness t2a of the insulating bottom portion 2a may be increased with respect to STI implementations. Subsequently, a double selective etching can be performed through the insulating bottom portion 2a: a first selective etching to form the aperture 30 down to the lower limit BTa of the insulating bottom portion 2a to expose part of the silicon material of the substrate 1, and a second selective etching to hollow out a volume 40 within the insulating bottom portion 2a and above the aperture 30. The hollowed volume 40 can be sized in depth and width to contain the nano-ridge transistor. Reference signs h40 and w40 can denote the depth and width of the hollowed volume 40, respectively. The thickness t2a can be larger than the depth h40 to allow the thickness t of the intermediate portion 3, so that aspect ratio trapping can be effective. Subsequently, the intermediate portion 3 and the III-V portions 4-7 may be grown epitaxially from the aperture 30 as described herein, for example according to the implementation of FIG. 1d. Growth of the III-V portion 7 may be continued until the top face thereof becomes a bit higher than the substrate surface S. The additional electrically insulating material 2b can be deposited to partially or completely fill the volume 40 around the nano-ridge, and the integrated circuit can be planarized, for example using a CMP process. The circuit structure of FIG. 4b can thus be obtained, in which the nano-ridge transistor can be flush with the silicon surface S, but located below this surface S. The circuit substrate thus provided with one or several nano-ridge transistors can be processed thereafter according to the MOS- or CMOS process. In some implementations, the nano-ridge transistors that have been produced in-substrate do not interfere with the MOS- or CMOS transistors to be produced. In addition, the electrical connections 14-16 can be produced at the same time as those dedicated to connecting the MOS- or CMOS transistors. FIG. 4c schematically represents a nano-ridge transistor according to some embodiments and a MOS transistor 100 which are next to each other at the surface S of the silicon substrate 1. Reference numbers 101, 102 and 103 denote the grid, the source and the drain of the MOS transistor 100, and reference numbers 111, 112 and 113 denote the electrical connections to the grid 101, the source 102 and the drain 103. The electrical connections 14-16 and 111-113 can all extend in the first low-k dielectric layer 2c which can be implemented for MOS or CMOS integrated circuits.

Figure 5A:
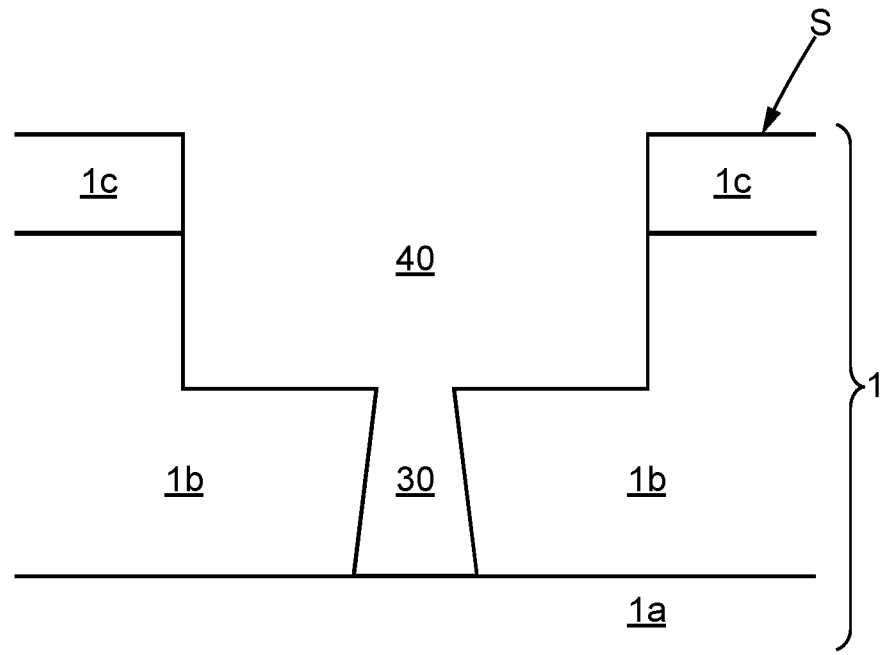
FIGS. 5a and 5b illustrate a method suitable to produce integrated circuits according to still another alternative implementation of the disclosed technology.
Figure 5B:
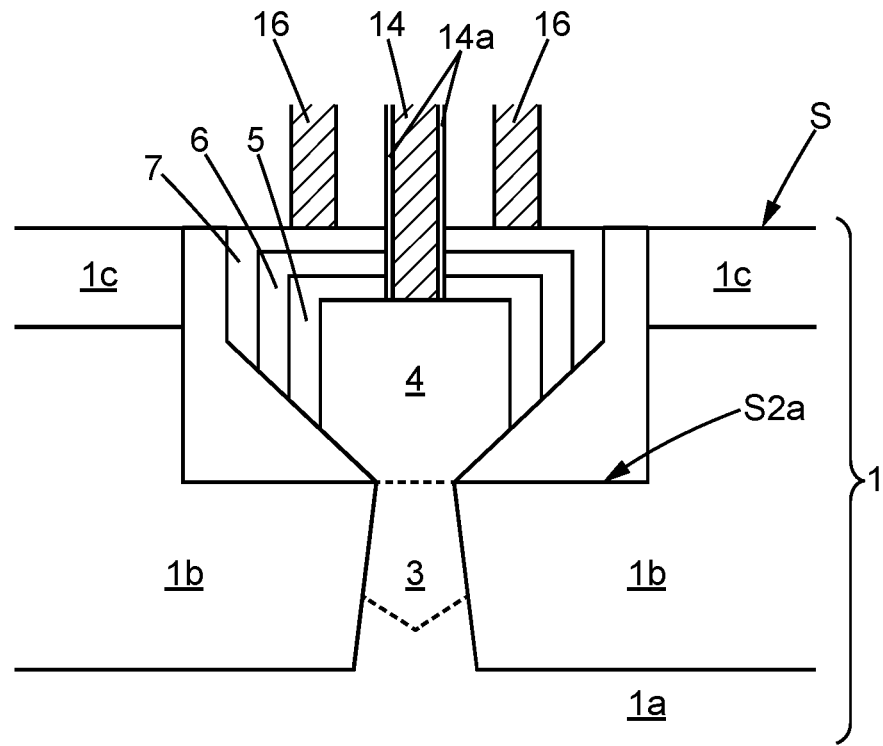

FIGS. 5a and 5b relate to still another implementation of the disclosed technology, which can be designed from a SOI-type substrate 1. The SOI-type substrate 1 can be or is comprised of a bulk silicon part 1a, a buried oxide (silica) layer 1b and an upper silicon layer 1c. For this implementation, the upper silicon layer 1c and the buried oxide layer 1b can be etched to form the aperture 30 and the hollowed volume 40. A hard mask used to selectively hollow out the volume 40 may be left on the upper silicon layer 1c. The aperture 30 can extend through the buried oxide layer 1b to the bulk silicon part 1a, so that part of the crystal silicon material of the bulk silicon part 1a is exposed. Subsequently, the nano-ridge transistor can be produced in a way similar to that described with reference to FIG. 4b, leading to the integrated circuit shown in FIG. 5b. The hard mask outside the hollowed volume 40 can provide no III-V material grows from the upper silicon layer 1c. Some such implementations can lead to the nano-ridge transistor located below the active surface S of the substrate 1.

Figure 6A:
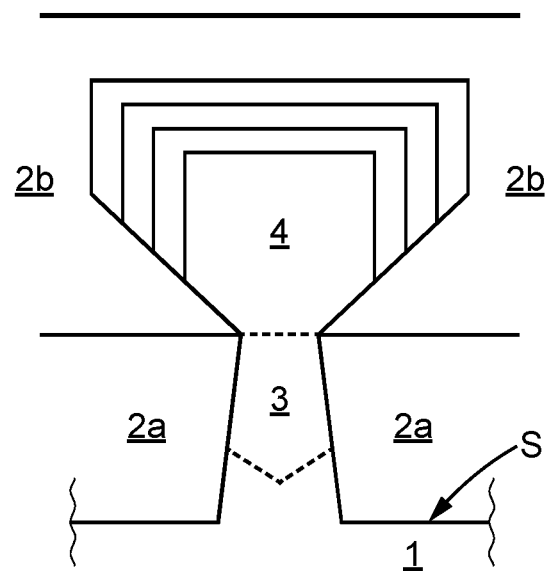
FIGS. 6a, 6b, and 6c illustrate a method suitable to produce integrated circuits according to still another alternative implementation of the disclosed technology.
Figure 6B:
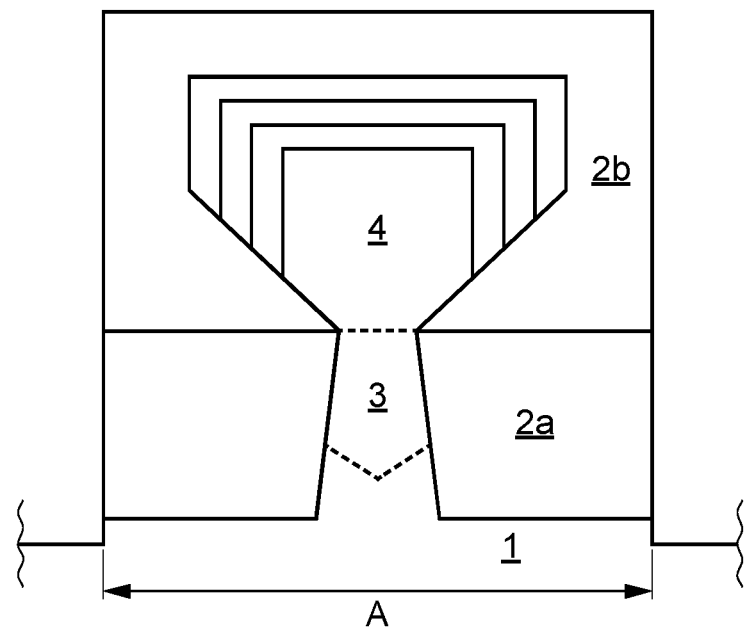
Figure 6C:
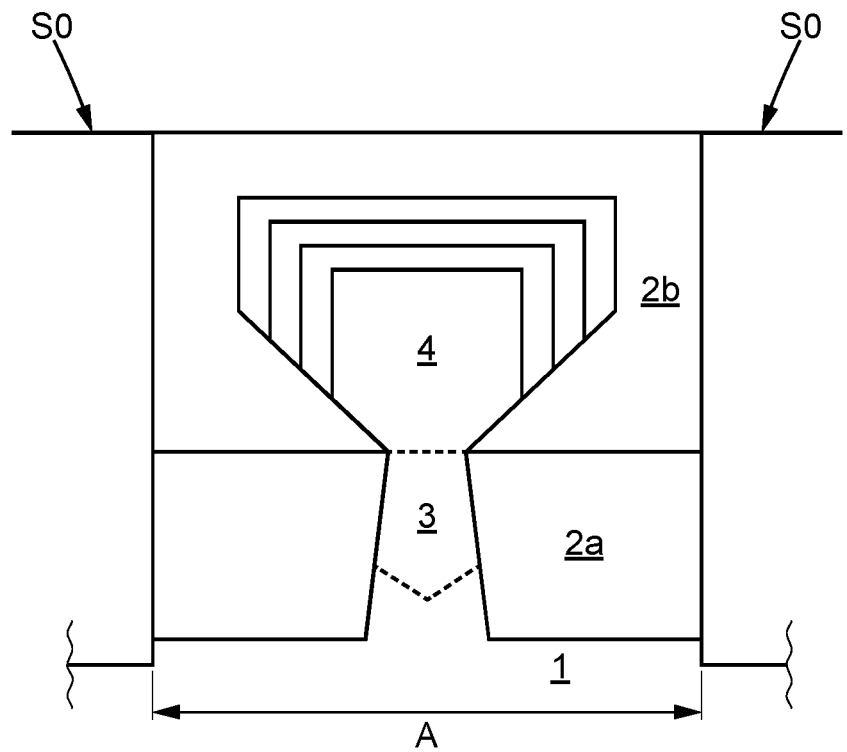

FIGS. 6a-6c relate to still another implementation of the disclosed technology, to produce a nano-ridge transistor located below the active surface of the integrated circuit. According to FIG. 6a, a nano-ridge transistor which may be similar to that of FIG. 1d can be produced on a bulk silicon substrate 1. The insulating bottom portion 2a can be obtained through the STI process. The III-V portions 3-7 can be embedded again in a layer of the additional insulating material 2b, for example silica. Subsequently, this layer of the additional insulating material 2b and the insulating bottom portion 2a can be etched outside an area A which comprises the III-V portions 3-7 (FIG. 6b). The etching can be continued until the silicon material of the substrate 1 is exposed, and silicon material can be grown epitaxially from the exposed silicon substrate outside the area A, until the silicon growth surface reaches or passes above the top level of the III-V portions 4-7. The integrated circuit being manufactured may subsequently be planarized using CMP process to produce the active circuit surface S0 (FIG. 6c), which surface S0 is to be used to process further the integrated circuit, possibly including MOS or CMOS transistor production.

Figure 7A:
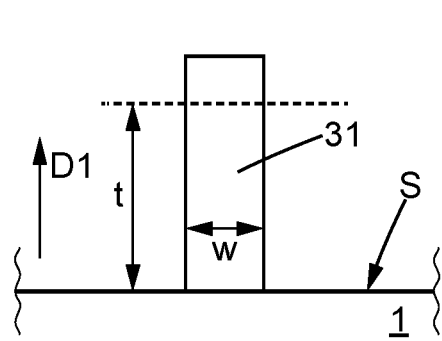
FIGS. 7a, 7b, 7c, 7d, 7e, and 7f illustrate methods suitable to produce integrated circuits according to still other implementations of the disclosed technology.
Figure 7B:
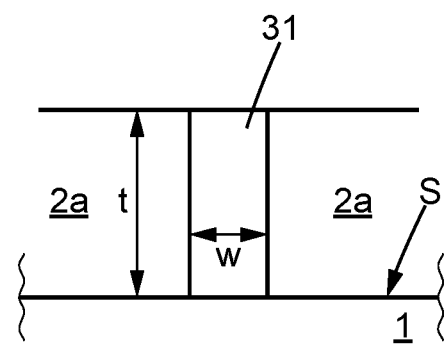

FIGS. 7a-7f relate to still other implementations of the disclosed technology, which may allow improved control of the cross-sectional outline of the intermediate portion 3 and/or that of the nano-ridge formed by the III-V portions 4-7. The method can start with forming an intermediate template portion 31 which is intended to determine the shape of the intermediate portion 3. The intermediate template portion 31 can be formed on the silicon surface S at a desired location and with the desired width w (FIG. 7a). The thickness of the intermediate template portion 31 along the direction D1 can be greater than that desired for the intermediate portion 3 and denoted t. The intermediate template portion 31 can thus be formed using any process known in the art or yet to be developed. It may include or be comprised of any material which can be etched selectively with respect to that of the electrically insulating bottom portion, and also e.g., with respect to silicon. Subsequently, the electrically insulating bottom portion 2a can be deposited so as to embed the intermediate template portion 31. The circuit can be planarized in a next step for providing the thickness t to both the intermediate template portion 31 and the electrically insulating bottom portion 2a (FIG. 7b). Thereafter, the intermediate template portion 31 can be removed selectively, so that a circuit configuration similar to that of FIG. 2a can be obtained. Wet etching may be implemented for the selective removal of the intermediate template portion 31. The method of producing the nano-ridge transistor and the whole integrated circuit can subsequently be completed as described herein.

Figure 7C:
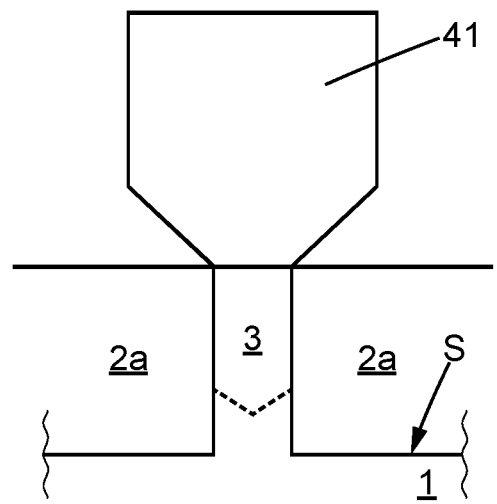
Figure 7D:
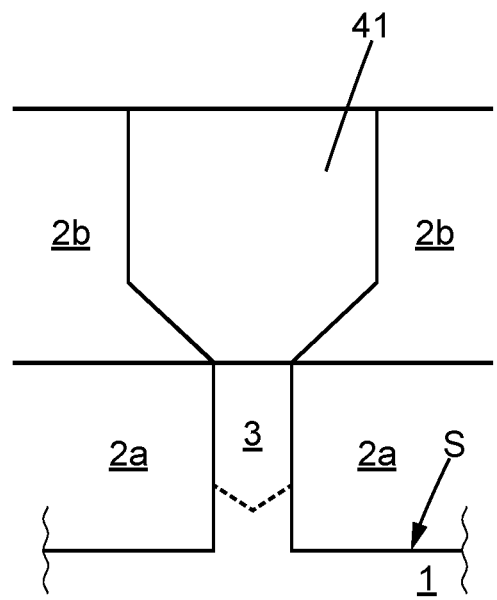
Figure 7E:
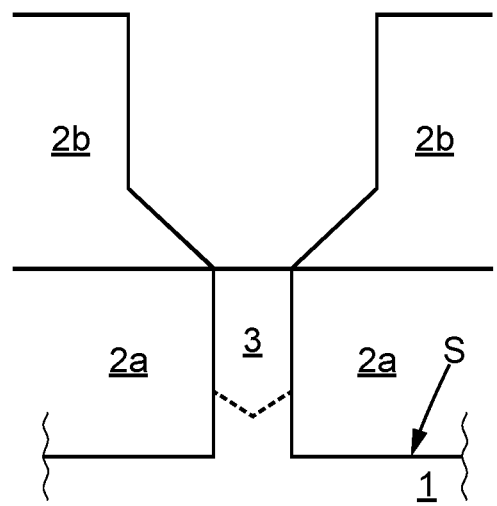
Figure 7F:
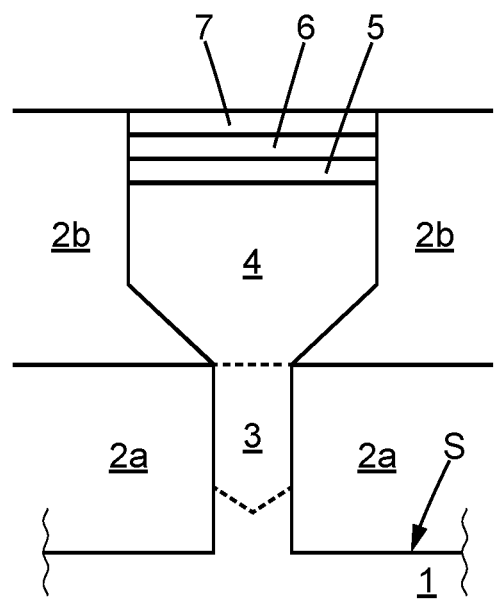

Alternatively to some such continuations of the circuit production methods, a nano-ridge template portion 41 may be formed above the intermediate portion 3, with a shape intended to match that desired for the nano-ridge of the III-V portions 4-7 (FIG. 7c). The nano-ridge template portion 41 can be formed using any process known in the art or yet to be developed, and may include or be comprised of any material which can be etched selectively with respect to the additional electrically insulating material. Subsequently, the layer of the additional electrically insulating material 2b can be deposited so as to embed the nano-ridge template portion 41. The circuit can be planarized to expose a top part of the nano-ridge template portion 41 (FIG. 7d). Thereafter, the nano-ridge template portion 41 can be removed selectively, so as to expose the top part of the intermediate portion 3 (FIG. 7e). Wet etching may be implemented for the selective removal of the nano-ridge template portion 41. Subsequently, the III-V portions 4-7 can be grown epitaxially so as to replace exactly the nano-ridge template portion 41 (FIG. 7f). The method of producing the integrated circuit can be completed as described herein.

In both cases, the intermediate template portion 31 and the nano-ridge template portion 41 may be referred to as being sacrificial in the general part of the description, because they do not remain in the final integrated circuit.

Figure 8A:
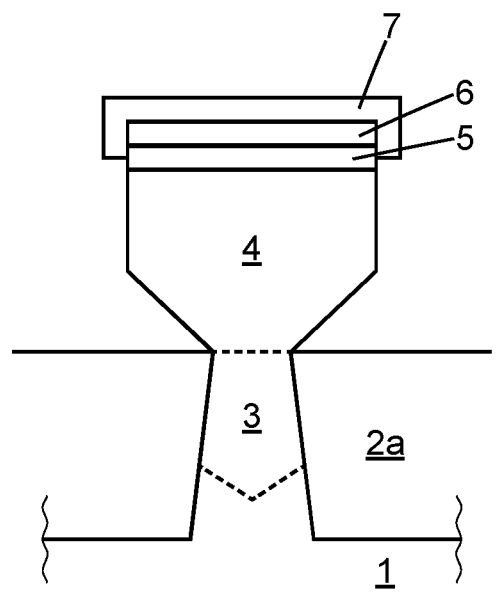
FIGS. 8a and 8b illustrate a method suitable to produce integrated circuits according to still another alternative implementation of the disclosed technology.
Figure 8B:
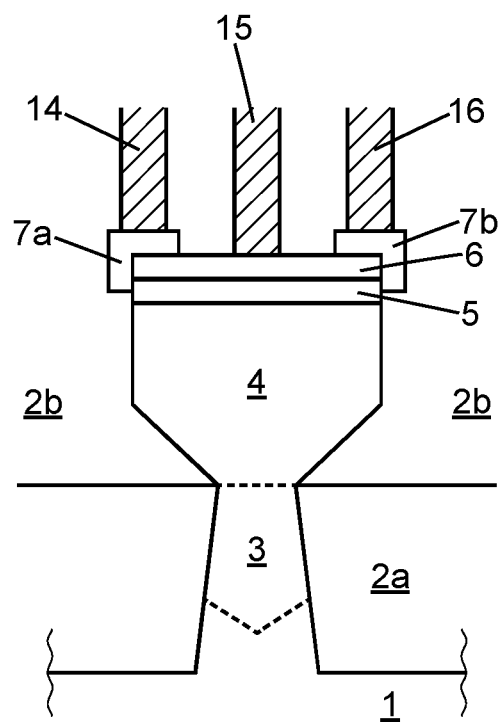

At least some of the methods described herein to produce a heterojunction bipolar transistor (HBT) may also be implemented to produce a high electron mobility transistor (HEMT) from a silicon substrate. FIG. 8a shows an epitaxial stack which can include an intermediate portion 3 grown from the silicon material of the substrate 1, a portion 4 which can form a non-intentionally doped buffer, a portion 5 which can form a non-intentionally doped channel, a portion 6 which can form a N− doped barrier, and a portion 7 which can form a N+ doped contact layer. The portions 4-7 can have III-V material compositions as before, but each selected appropriately with respect to the electronic function of the corresponding portion in the HEMT transistor operation. Intrinsic doping may be implemented. The intermediate portion 3 can extend through the electrically insulating bottom portion 2a, so as to produce aspect ratio trapping. In some implementations, the portion 7 may be grown in a manner suitable to wrap the portion 6 and at least part of the portion 5. It is subsequently patterned to form separate contact portions 7a and 7b, which can be located on opposed sides of the nano-ridge as shown in FIG. 8b. The HEMT transistor may also be completed with embedding the transistor in a layer of additional electrically insulating material 2b, and subsequently forming the electrical connections 14-16. For such HEMT transistor, the electrical connection 15 can be that of the grid, and the electrical connections 14 and 16 can be those of the source and the drain, respectively. Some such HEMT-type transistors may be combined with any of the transistor structures proposed by the disclosed technology and described herein for HBT-type transistors.

It should be understood that any implementation of the disclosed technology may be combined with any technology used for producing contacts between the electrical connections and the III-V portions of the nano-ridge transistor. In particular, an intermediate material may be used between each electrical connection and the III-V portion contacted, in particular for lowering the contact resistance value and/or for avoiding that an element which belongs to the composition of the electrical connection diffuses into the III-V portion. Also, contact regrowth may be implemented. It allows decoupling the doping of the III-V portion from that of the contact region.

What is claimed is:

1. An integrated circuit which includes at least one transistor, the circuit comprising:
    a crystal silicon substrate having a silicon surface;
    a nano-ridge transistor, which comprises at least three III-V semiconducting crystal portions superposed such that at least part of one of the III-V portions is intermediate between respective parts of two other ones of the III-V portions along a superposition direction, and a first one of the III-V portions is connected to the silicon surface of the substrate through an epitaxial material transition, and those of the III-V portions which are next to one another have epitaxial interfaces in-between;
    at least three electrical connections which are arranged such that three parts of the III-V portions of the nano-ridge transistor are each electrically contacted by at least one of the electrical connections; and
    an electrically insulating portion which is supported by the silicon substrate and abuts laterally against at least one of the III-V portions,
    wherein the first III-V portion of the nano-ridge transistor is connected to the silicon surface through an intermediate portion which contains the epitaxial material transition, the intermediate portion being abutted laterally by the electrically insulating portion, and equal or less in thickness than the electrically insulating portion along a direction perpendicular to the silicon surface, and having an aspect ratio greater than unity, the aspect ratio being equal to a thickness of the intermediate portion divided by a width of the intermediate portion which is measured parallel to the silicon surface.

2. The integrated circuit of claim 1, wherein an epitaxial interface between silicon and a material of the first III-V portion has a V-shape within the intermediate portion, with a V-tip oriented towards the silicon substrate.

3. The integrated circuit of claim 1, wherein a cross-sectional area of the first III-V portion parallel to the silicon surface increases when moving away from the silicon surface for at least part of the first III-V portion which is close to the intermediate portion.

4. The integrated circuit of claim 1, wherein the superposition direction is perpendicular or parallel to the silicon surface, for at least respective parts of the III-V portions which are superposed along the superposition direction.

5. The integrated circuit of claim 4, wherein at least one of the epitaxial interfaces existing between two of the III-V portions has a U-shape in a cross-sectional plane which is perpendicular to the silicon surface, with two U-arms pointing towards the silicon substrate.

6. The integrated circuit of claim 4, wherein at least one of the electrical connections has a contact interface with one of the III-V portions, the contact interface being perpendicular to the silicon surface.

7. The integrated circuit of claim 1, further comprising at least one MOS- or CMOS transistor, wherein at least one of the electrical connections to the nano-ridge transistor and other electrical connections to the MOS- or CMOS transistor have respective segments which all belong to one and a same connection level of the integrated circuit.

8. The integrated circuit of claim 1, wherein the nano-ridge transistor is a heterojunction bipolar transistor, with three of the III-V portions forming an emitter, a base, and a collector of the nano-ridge transistor, respectively.

9. The integrated circuit of claim 8, further comprising a fourth one of the III-V portions forming a sub-collector of the nano-ridge transistor.

10. The integrated circuit of claim 8, wherein a portion of the silicon substrate which is connected to the first III-V portion through the intermediate portion forms one of the electrical connections.

11. The integrated circuit of claim 1, wherein the nano-ridge transistor is a high electron-mobility transistor, with the first III-V portion forming a non-doped buffer, a second one of the III-V portions forming a non-doped channel, a third one of the III-V portions forming a barrier which has a doping region spatially separate from the channel.

12. The integrated circuit of claim 11, wherein a fourth one of the III-V portions forms a contact layer for source and drain of the nano-ridge transistor.

13. The integrated circuit of claim 1, wherein the aspect ratio is greater than or equal to 1.7.

14. A method of producing the integrated circuit of claim 1, the method comprising:
/1/ providing the crystal silicon substrate, with part of the silicon surface of the substrate which is covered by an electrically insulating bottom-portion, and with an aperture through the electrically insulating bottom portion where an area of the silicon surface is selectively exposed, and such that a ratio of a thickness of the electrically insulating bottom portion next to the aperture over a width of the aperture is greater than unity, the thickness and width being measured perpendicular and parallel to the silicon surface, respectively;
/2/ from the exposed area of the silicon substrate, growing the intermediate portion and subsequently the first III-V semiconducting crystal portion using an epitaxial growing process, wherein the intermediate portion contains the epitaxial material transition between silicon and the first III-V portion, and is equal or less in thickness than the electrically insulating bottom portion along the direction perpendicular to the silicon surface, such that at least the intermediate portion is limited laterally during the epitaxial growing process by the electrically insulating bottom portion around the aperture;
/3/ growing successively at least two further III-V semiconducting crystal portions, using epitaxial growing processes from the first III-V portion and subsequently from the III-V portion just preceding, and such that at least part of one of the III-V portions is intermediate between respective parts of two other ones of the III-V portions along a superposition direction; and
/4/ forming the at least three electrical connections which are arranged so that three parts of the III-V portions are each electrically contacted by at least one of the electrical connections,
and the method also comprising depositing additional electrically insulating material, so that the additional electrically insulating material abuts laterally against at least one of the III-V portions, in addition to the electrically insulating bottom portion abutting against the intermediate portion.

15. The method of claim 14, wherein the ratio of the thickness of the electrically insulating bottom portion next to the aperture over the width of the aperture is greater than or equal to 1.7.

16. The method of claim 14, wherein the aspect ratio is greater than 1.7.

17. The method of claim 14, wherein the silicon surface of the substrate is perpendicular to a [001] crystal direction of silicon and of the III-V portions.

18. The method of claim 14, wherein /1/ comprises:
etching the silicon substrate so as to form a cavity and lower the silicon surface; followed by
forming the electrically insulating bottom portion within the cavity; followed by
hollowing out the aperture and a volume in the electrically insulating bottom portion, the hollowed volume being in line with the aperture along the direction perpendicular to the silicon surface,
wherein a depth of the hollowed volume is selected so that the nano-ridge transistor is contained in the hollowed volume below the silicon surface of the substrate as existing before the substrate has been etched.

19. The method of claim 14, wherein the silicon substrate is of silicon-on-insulator type and comprises a bulk crystal silicon substrate, which is covered by a buried oxide layer and an upper layer of crystal silicon, and wherein the buried oxide layer forms the electrically insulating bottom portion, and the aperture is formed through at least part of the buried oxide layer, and wherein the intermediate portion is grown in /2/ from the bulk crystal silicon substrate, or from a crystal silicon extension which has been grown epitaxially from the bulk crystal silicon substrate in the aperture.

20. The method of claim 14, wherein /1/ comprises:
forming a sacrificial intermediate template on the substrate, which intermediate template extends from the silicon surface of the substrate and has a shape which matches side faces of the intermediate portion;
forming the electrically insulating bottom portion on the silicon surface so that the intermediate template is embedded in the electrically insulating bottom portion;
polishing the electrically insulating bottom portion until the intermediate template becomes uncovered; and
selectively removing the intermediate template so that the silicon surface of the substrate becomes exposed through the electrically insulating bottom portion, thereby forming the aperture, and wherein /2/ is carried out so that the intermediate portion replaces the intermediate template.

21. The method of claim 14, wherein /2/ comprises the:

growing the intermediate portion from the exposed area of the silicon substrate using the epitaxial growing process, the intermediate portion being limited laterally when growing by the electrically insulating bottom portion;

forming a sacrificial nano-ridge template which extends above and from the intermediate portion and has a shape which matches side faces of the nano-ridge transistor;

depositing the additional electrically insulating material on the electrically insulating bottom portion, so that the nano-ridge template is embedded in the additional electrically insulating material;

polishing the additional electrically insulating material until the nano-ridge template becomes uncovered;

selectively removing the nano-ridge template so that the intermediate portion becomes exposed through the additional electrically insulating material; and growing epitaxially the first III-V portion and the subsequent at least two further III-V portions from the exposed intermediate portion, so that the first and further III-V portions replace the nano-ridge template.

\* \* \* \* \*